United States Patent
Borst

(10) Patent No.: US 7,735,217 B2
(45) Date of Patent: Jun. 15, 2010

(54) DEVICE FOR ASSEMBLING PINS ONTO A CIRCUIT BOARD BACKGROUND

(75) Inventor: Joachim Borst, Donaueschingen (DE)

(73) Assignee: MC Technology GmbH, Blumberg (DE)

( * ) Notice: Subject to any disclaimer, the term of this patent is extended or adjusted under 35 U.S.C. 154(b) by 28 days.

(21) Appl. No.: 11/819,380

(22) Filed: Jun. 27, 2007

(65) Prior Publication Data

US 2008/0000078 A1    Jan. 3, 2008

(30) Foreign Application Priority Data

Jun. 28, 2006   (DE) ...................... 10 2006 030 135

(51) Int. Cl.
    *B23P 19/00*    (2006.01)
(52) U.S. Cl. .............................. 29/741; 29/729; 29/739; 29/740; 29/743
(58) Field of Classification Search .................. 29/741, 29/703, 710, 743, 831, 832, 739, 748, 751, 29/759, 762; 439/109, 571, 45, 46, 324, 439/823, 135
    See application file for complete search history.

(56) References Cited

U.S. PATENT DOCUMENTS

| | | | | |
|---|---|---|---|---|
| 2,877,441 A | * | 3/1959 | Narozny ..................... 439/857 |
| 4,046,445 A | * | 9/1977 | Anhalt ........................ 439/109 |
| 4,620,757 A | * | 11/1986 | Thevenaz ................. 439/733.1 |
| 4,892,449 A | * | 1/1990 | Croxton ........................ 411/54 |
| 5,147,209 A | | 9/1992 | Litwin et al. |
| 5,373,626 A | * | 12/1994 | Youngfleish ................. 29/739 |
| 5,439,400 A | | 8/1995 | Kozel et al. |
| 5,509,192 A | * | 4/1996 | Ota et al. ....................... 29/741 |
| 5,571,022 A | * | 11/1996 | Schaarschmidt ............ 439/135 |
| 5,643,016 A | * | 7/1997 | Huss, Jr. ..................... 439/744 |
| 5,655,930 A | * | 8/1997 | Dechelette et al. .......... 439/571 |

FOREIGN PATENT DOCUMENTS

| | | |
|---|---|---|
| DE | 44 22 787 A1 | 1/1995 |
| GB | 2 284 948 A | 6/1995 |

* cited by examiner

*Primary Examiner*—Derris H Banks
*Assistant Examiner*—Tai Nguyen
(74) *Attorney, Agent, or Firm*—Jerald L. Meyer; Derek Richmond; Sungyeop Chung

(57) ABSTRACT

For purposes of assembling contact pins (12) disposed in a row onto a circuit board (16), the pins (12) are grasped via a force fit in an insulating body (20) at their ends facing away from the circuit board (16)and are supported to prevent tilting. The body (20) has a suction surface (26) for an automated assembly device. After insertion of the pins (12) into the circuit board (16) and after the soldering process, the body (20) is pulled off the pins (12), so that they sit freely in the circuit board (16).

8 Claims, 15 Drawing Sheets

DEVICE FOR ASSEMBLING PINS ONTO A CIRCUIT BOARD BACKGROUND

FIELD

The invention relates to a device for assembling pins arranged in at least one row, spaced apart from each other, serving as electrical contacts, onto a circuit board, in accordance with the preamble of claim 1.

BACKGROUND

Electrical connections to circuit boards make use of plug-in connectors, among other things, in which contact pins are disposed in one or several rows. In general, these pins of the plug-in connector, which serve as electrical contacts, are assembled onto the circuit board. To attach the pins and to produce a conductive connection with the circuit board, both through-hole assembly (THT technology) and surface mounting (SMD technology) are used. In general, the pins are held in an electrically insulating body in the form of a pin strip, and this body holds the pins at the spacing desired for the plug-in connector.

For purposes of automatic assembly, automated assembly devices are frequently used that grasp the pin strip with a suction head, in order to remove it from a feed magazine and place it onto the desired location on the circuit board. For this purpose, a small suction plate is provided, which is set onto a few pins of the pin strip and pulled off after the pin strip has been positioned and soldered onto the circuit board.

In the attached drawing, examples of this known device are shown in FIGS. 16 to 20. FIGS. 16 to 18 show an assembly device using the through-hole or push-through method. The pin strip has an insulating body 10 made of plastic, into which pins 12 are inserted at a predetermined raster distance. For purposes of handling the pin strip by means of an automated assembly device, a small suction plate 14 (pick-and-place pad) is set onto the center pins 12, which plate forms a suction surface for the suction head of the automated assembly device. The automated assembly device grasps the pin strip at the small suction plate 14 with its suction head, and positions the pin strip on a circuit board 16. After the pins are positioned and soldered onto the circuit board 16, the small suction plate 14 is pulled off, as shown in FIG. 17. FIG. 18 shows the pin strip as assembled onto the, circuit board 16, using through-hole technology, in a partial sectional view. FIGS. 19 and 20 show a corresponding pin strip, in which the pins 12 are angled away at the ends where they are to be set onto the circuit board 16, SO that surface assembly of the pin strip onto the circuit board 16 is enabled, as shown in FIG. 20.

Such a device for assembling a pin strip onto a circuit board is known, for example, from U.S. Pat. No. 6,224,399 B1.

SUMMARY

This invention is based on the task of making the assembly of the pins onto the circuit board more cost-advantageous and simpler.

This task is accomplished, according to the invention, by means of a device having the characteristics of claim 1.

Advantageous embodiments of the invention are specified in the dependent claims.

The invention is based on the idea of combining the body that accommodates and positions the pins and the small suction plate for the automated assembly device in a single plastic part. On the one hand, this single plastic part forms a body that holds the pins, positions them with the predetermined spacing, and aligns them axially parallel. On the other hand, this body can serve as a suction surface for the automated assembly device. This is possible because the body grasps the pins at their end facing away from the circuit board, so that the suction surface can be configured at the back of the body, i.e. on its surface facing away from the pins. Since, according to the invention, only a single plastic piece is required both for holding and positioning the pins and for handling by an automated assembly device, the material requirement and the production effort are reduced.

After assembly of the pins onto the circuit board and soldering the pins onto the circuit board, the body is pulled off the pins, so that the pins are arranged on the circuit board without any additional connecting insulating body. As a result, a plug-in connection having a lesser height can be achieved, so that the space requirement for the plug-in connection is reduced and the plug-in connection can be integrated into the entire installation situation in a more advantageous manner.

For the body to be able to fulfill the required functions of positioning and alignment of the pins, the body is configured in a manner such that it grasps the ends of the pins with respect to the axis of the pins, in a force-fit manner and in a form-fitting manner to prevent tilting of the axis of the pins. The pins can be held in the body in their axial position for the assembly process, with the force-fitted holding device allowing the body to be subsequently pulled off after the soldering process. The form-fitting holding device, which prevents the axis of the pins from tilting, assures the axially parallel orientation of the pins in the body, thereby ensuring that, when they are set down onto the circuit board during assembly, the ends of the pins that come into contact with the circuit board have precisely the same spacing as the opposite ends of the pins that are positioned in the body.

The axially force fitting and radially form-fitting hold of the pins in the body is preferably achieved in that the pins are held in the body as clamped in a bushing shaped receptacle. In particular, the receptacle can be configured as a bushing that is split axially, which projects away from the body coaxial with the pin.

The body, which is preferably a plastic injection-molded part, extends over the entire length of the row of pins, so that it can accommodate and position all of the pins of the row. The width of the body crosswise to the row of pins merely has to be sufficient to allow reliable accommodation and holding of the pins. If this width is not sufficient for suctioning by the suction head of the automated assembly device, the width can be increased in the region of the suction surface. A material saving is possible by limiting the widening to the region of the suction surface.

To achieve reliable contacting of the circuit board by the pins, it is advantageous if the axial position of the pins with respect to the circuit board is determined by a stop during assembly. This stop can be determined by the shape of the pins. In case of the configuration as through-hole pins, this stop can be formed by means of a radial shoulder on the pins. In the case of surface mounting of the pins, the stop results from setting the pins onto the circuit board, or respectively onto the solder pads of the circuit board. If the axial position of the pins with respect to the circuit board is determined by the shape of the pins, tolerances in the axial positioning can be balanced out in that the pins are held in the body with a free path behind the end of the pins that is contained in the body. Axial tolerance errors are then compensated for when the pins are set onto the circuit board in that the pins are pressed axially into this free path to a different extent until all of the pins sit on the circuit board with their stop, in axially precise manner.

In another variant, which is particularly suitable for through-hole technology, the stop for the axial positioning of the pins in the circuit board can also be configured on the body, e.g. by means of spacers that project from the body against the circuit board, parallel to the pins.

BRIEF DESCRIPTION OF THE DRAWINGS

In the following, the invention will be explained in greater detail using the example embodiments shown in the drawing. This shows FIG. 1 the device in a first embodiment in perspective, FIG. 2 the device, in perspective, after assembly onto a circuit board, FIG. 3 a side view of FIG. 2 with a partial vertical section, FIG. 4 a second embodiment of the device, in perspective, FIG. 5 the device after it has been set onto the circuit board, in perspective, FIG. 6 a side view of FIG. 5, with a partial vertical section, FIG. 7 a representation corresponding to FIG. 5, after the body has been pulled off, FIG. 8 a perspective view of a third embodiment of the device, FIG. 9 the device after it has been set onto the circuit board, in perspective, FIG. 10 the device after the body has been pulled off, in perspective, FIG. 11 a fourth embodiment of the device, in perspective, FIG. 12 the device after it has been set onto the circuit board, in perspective, FIG. 13 a side view, of FIG. 12 with a partial vertical section, FIG. 14 the device after the body has been pulled off, in perspective, FIG. 15 a side view of FIG. 15, with a partial vertical section, and FIGS. 16 to 20 the embodiments of the device according to the state of the art, as described initially.

DETAILED DESCRIPTION

Figure 1:
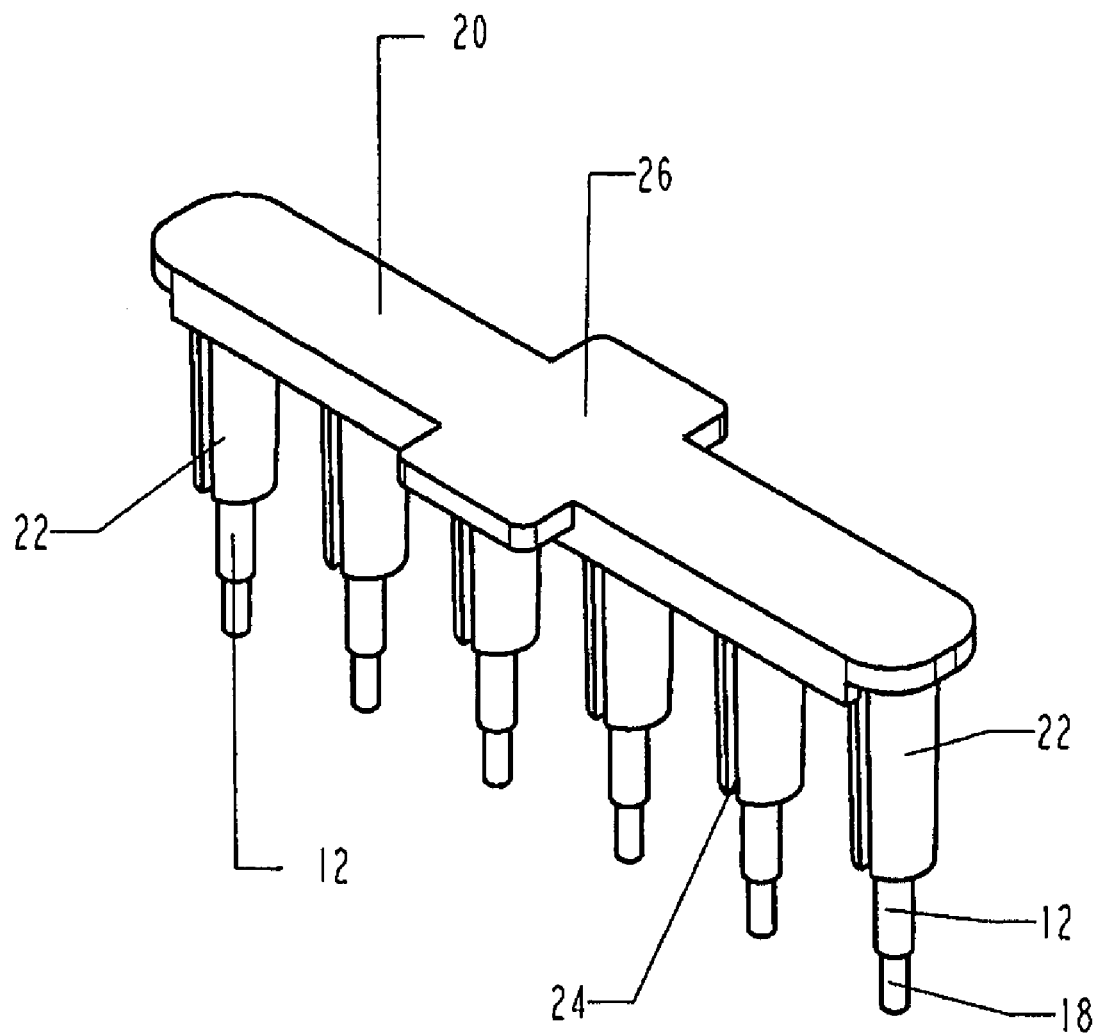
Figure 2:
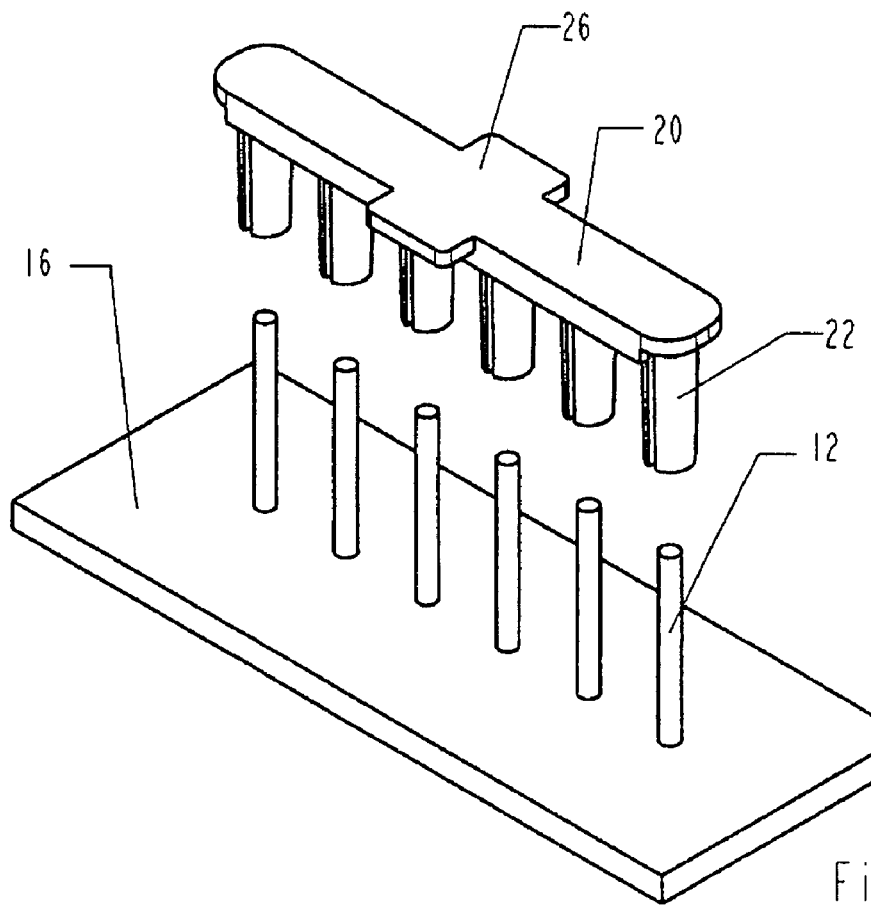
Figure 3:
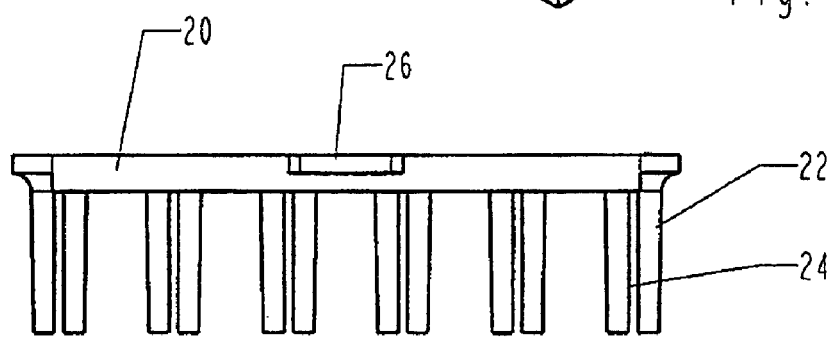
Figure 3:
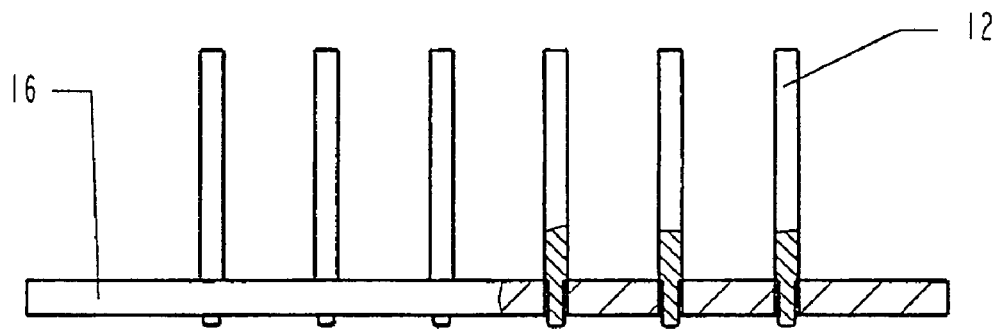
Figure 4:
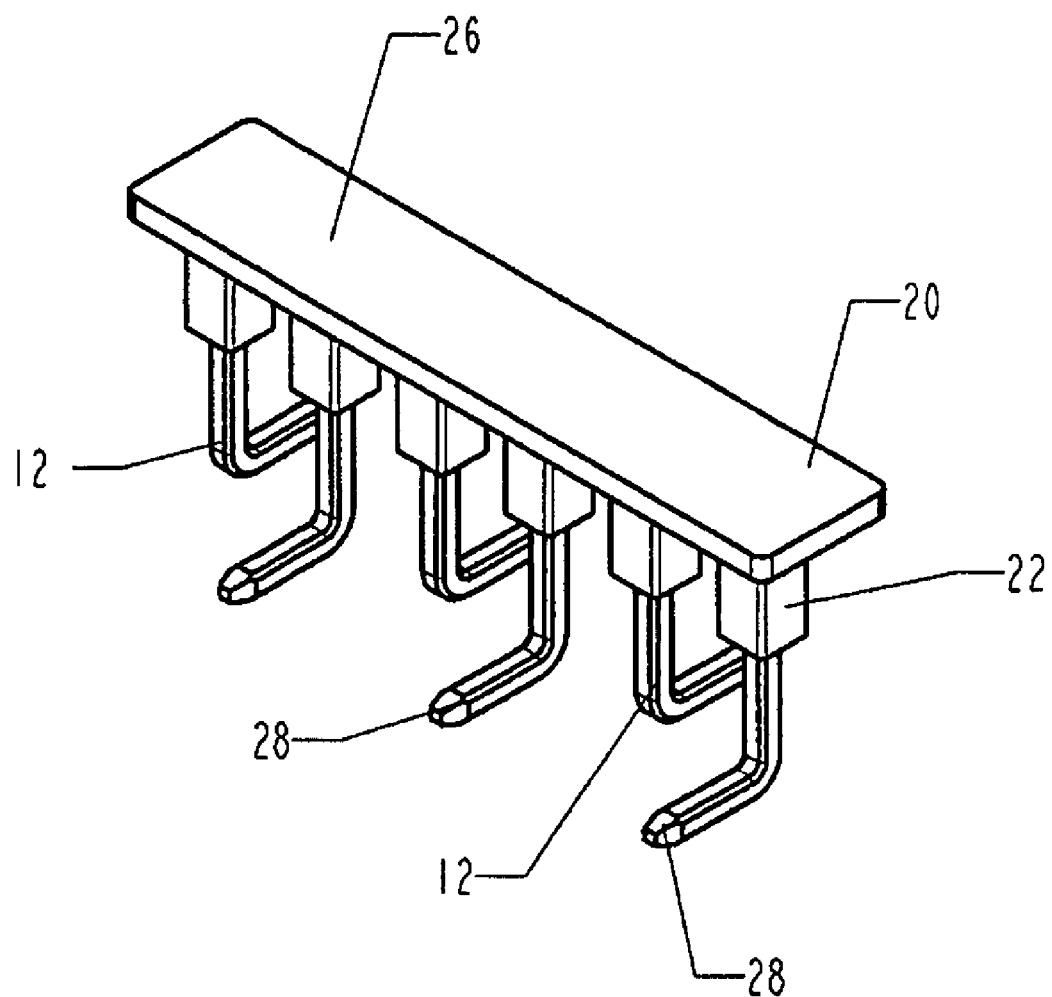

FIGS. 1 to 3 show a first example embodiment of the invention.

To make an electrically conductive contact to a circuit board 16 by means of a plug-in connection, electrically conductive pins 12 are inserted into the circuit board 16, which pins, in the example embodiment shown, are disposed in a row, with identical spacings between them. In the example embodiment shown, six pins 12 are disposed in a row. It is readily evident that, depending on the configuration of the plug-in connector, a different number of pins 12 can also be provided and/or that the pins 12 can also be arranged in two or more rows.

The pins 12 are intended for through-hole assembly or push-through assembly. Accordingly, the pins 12 are configured as straight rods, e.g. having a circular cross-section. At their end that is to be inserted into the holes of the circuit board 16, the pins 12 are configured with a reduced diameter, so that a radial contact shoulder 18 is formed at the transition to the full cross-section of the pins 12. Such a radial contact shoulder 18 can also be formed by an outer collar of the pin 12.

A body 20 made of electrically insulating plastic has the shape of a flat bar whose length corresponds to the length of the row of pins 12. On the flat underside of the body 20, bushings 22 are formed on in one piece; their number and mutual spacing corresponds to the number and the spacing of the pins 12. The bushings 22 project away from the bottom surface of the body 20 at a right angle. The axial length of the hollow bushings 22 corresponds approximately to at least one-third of the axial length of the pins 12; preferably, the length amounts to approximately ½ to ⅔ of the length of the pins 12. The bushings 22 are slit axially, preferably over their entire length, by means of a diametrally continuous slit 24. As a result, the wall of the bushings 22 forms two tongues that are slightly elastically deformable. The clear inside cross-section of the bushings 22 corresponds to the outside cross-section of the pins 12. When the pins 12 are inserted into the bushings 22 with their ends that face away from the circuit board, the pins 12 are held in place in the bushings 22 by means of the elastic spring force of the slit bushing 22 with a force fit so as to prevent any axial displacement. The pins 12 are supported by the bushings 22 with a positive fit to prevent tilting of the axis of the pins 12 with respect to the body 20.

The width of the body 20 transverse to the row of the pins 12 essentially corresponds to the outer diameter of the bushings 22. In the center region of the longitudinal extent of the body 20, its surface lying opposite the bushings 22 has a widened region which forms a suction surface 26. The width of this suction surface 26 and its length in the direction of the longitudinal extent of the body 20 are dimensioned so that a suction surface 26 is formed, which is sufficient for the suction head of an automated assembly device to pick it up.

The bodies 20 with the pins 12 set into the bushings 22 and held in them by a friction fit are supplied as a pre-assembled component by a feed magazine of the automated assembly device. The suction head of the automated assembly device picks up the component at the suction surface 26, transports it to a circuit board 16, and sets the component onto the circuit board 16 SO that the pins 12 are inserted into the holes of the circuit board 16. The pins 12 are inserted into the holes of the circuit board 16 until they rest against the circuit board 16 with their contact shoulder 18. The inserted pins 12 are soldered to the conductive paths of the circuit board 16. After this soldering process, the body 20 is pulled off the pins, which have now been fixed in place in the circuit board 16, counter to the clamping effect of the bushings 22, as shown in FIGS. 2 and 3.

As can be seen in FIGS. 2 and 3, the pins 12 are inserted into the circuit board 16 in a freestanding manner, without any additional component holding the pins 12, as is the case for the body 10 of the embodiment according to the state of the art shown in FIGS. 16 to 20.

FIGS. 4 to 7 show a second embodiment of the device. To the extent that this embodiment agrees with the first embodiment, the same reference numbers are used, and reference is made to the above description.

In contrast to the first embodiment, in the case of the second embodiment of FIGS. 4 to 7, the pins 12 are configured for surface mounting (SMD technology). For this purpose, the pins 12, which in this case have a multi-sided, particularly a four-sided cross-section, have a lower end 28 that is bent at right angles, with which the pins 12 are placed onto the circuit board 16, in order to be soldered onto the circuit board.

In correspondence with the four-sided cross-section of the pins 12, the bushings 22 are also configured with a four-sided cross-section. In the second example embodiment the bushings 22 are not slit axially; instead, the inside cross-section of the bushings 22 is dimensioned so that the pins 12 fit into the bushings 22 with a friction fit.

Furthermore, in the case of the second example embodiment, the top of the entire body 20 is configured with a constant width having the required size for engaging the suction head of the automated assembly device. It is therefore not necessary to configure the suction surface 26 separately.

Figure 5:
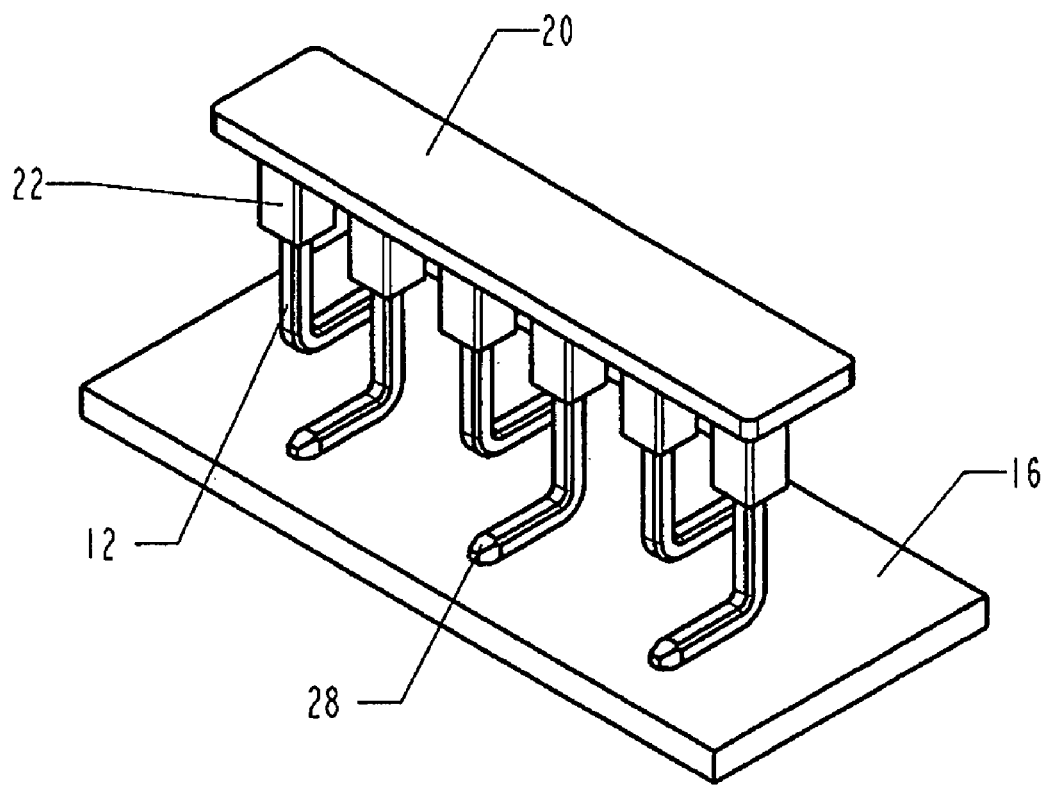
Figure 6:
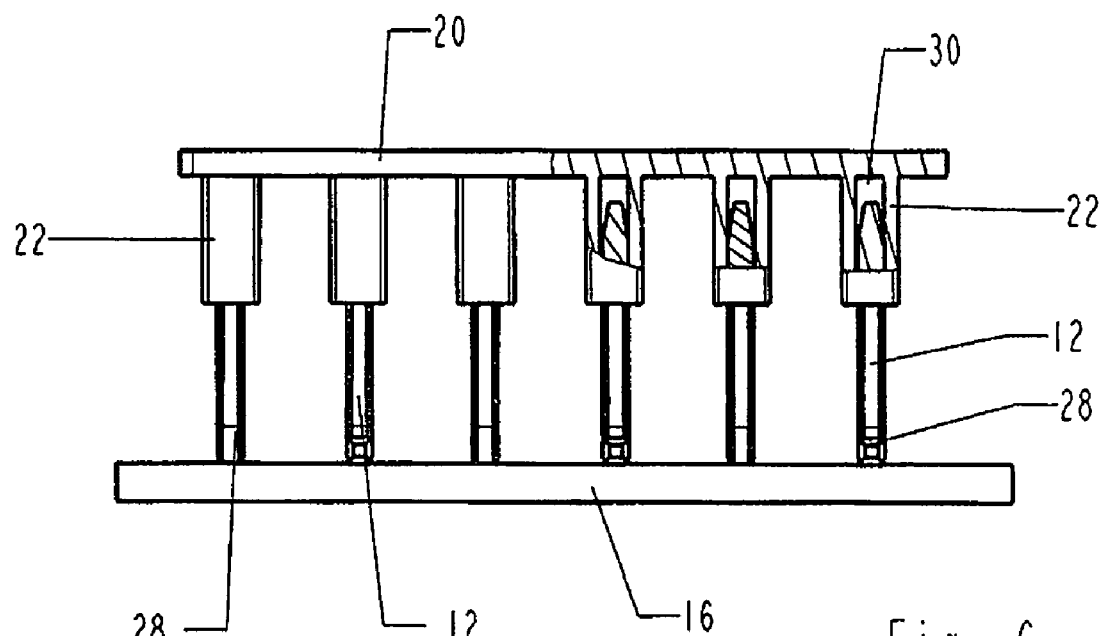

The component consisting of the body 20 with the inserted pins 12 is set onto the circuit board 16 in the manner described above by means of the automated assembly device, as shown in FIGS. 5 and 6. As shown in the sectional representation of FIG. 6, the pins 12 are inserted into the bushings 22 so that a free path 30 remains in the bushing 22 behind the end of the pin 12. This free path 30 makes it possible for the pins 12 to be pressed into the respective bushings 22 to different depths when the pins 12 are set onto the circuit board 16. As a result, tolerances in the axial positioning of the pins 12 with regard to the circuit board 16 can be compensated for, and it is assured that the angled ends 28 of all of the pins 12 sit reliably on the circuit board so that they can be properly soldered.

Of course, such a free path 30 can also be provided in the case of all other embodiments.

Figure 7:
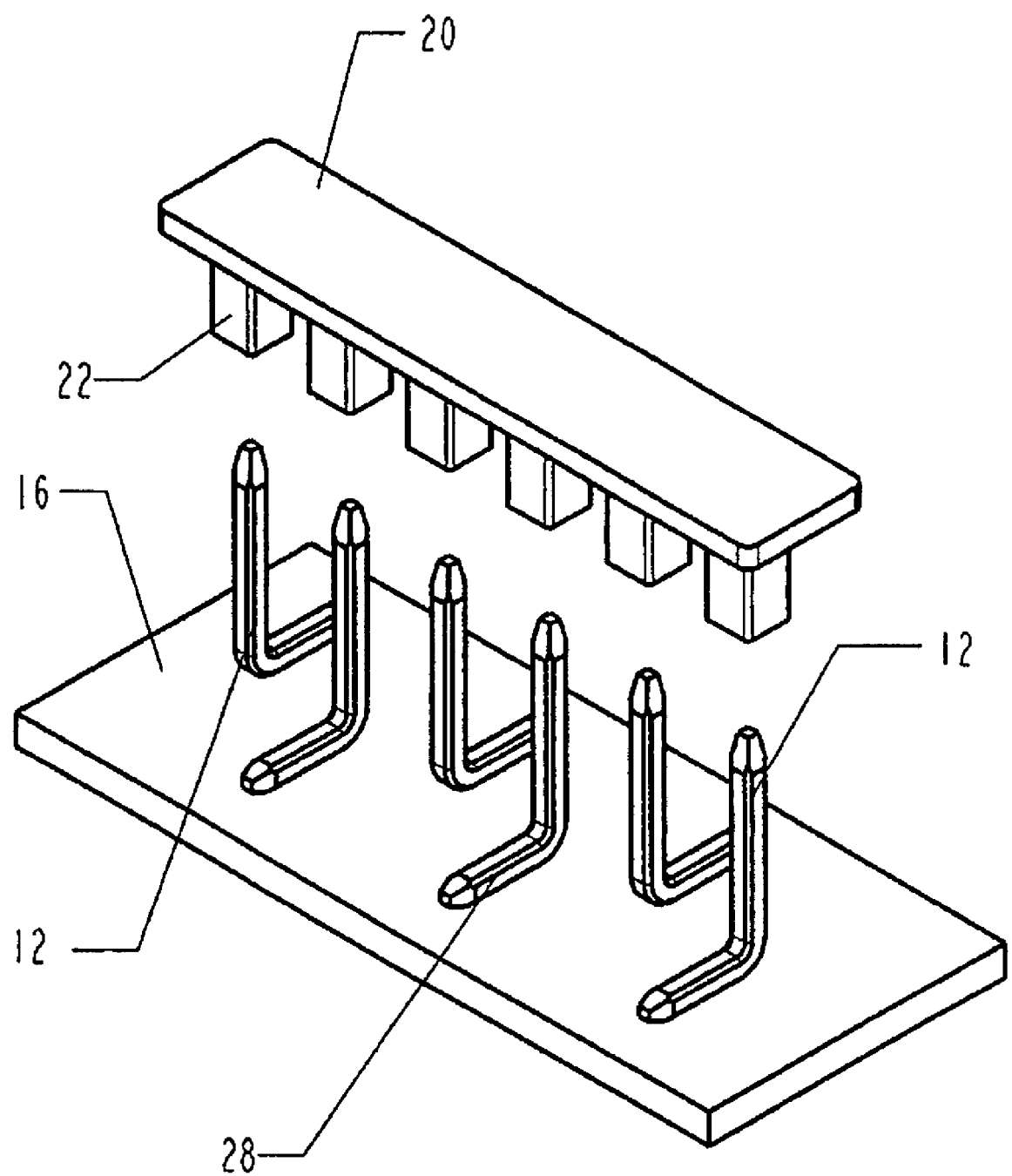

After the soldering process, once the pins 12 are firmly connected with the circuit board 16, the body 20 is pulled off the pins 12, as shown in FIG. 7. The pins 12 for the plug-in connection stand freely on the circuit board 16, without any additional auxiliary body.

Figure 8:
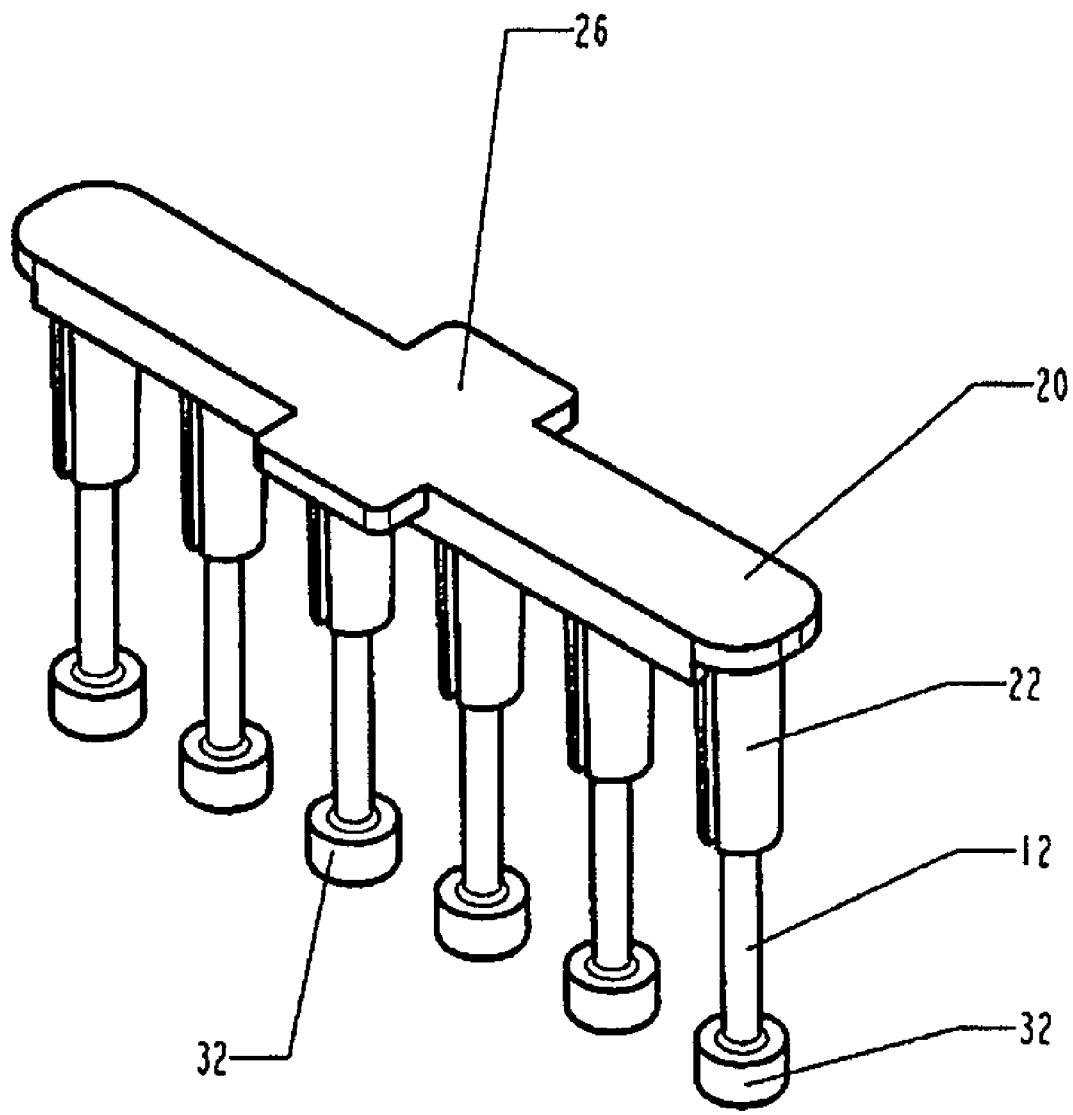
Figure 9:
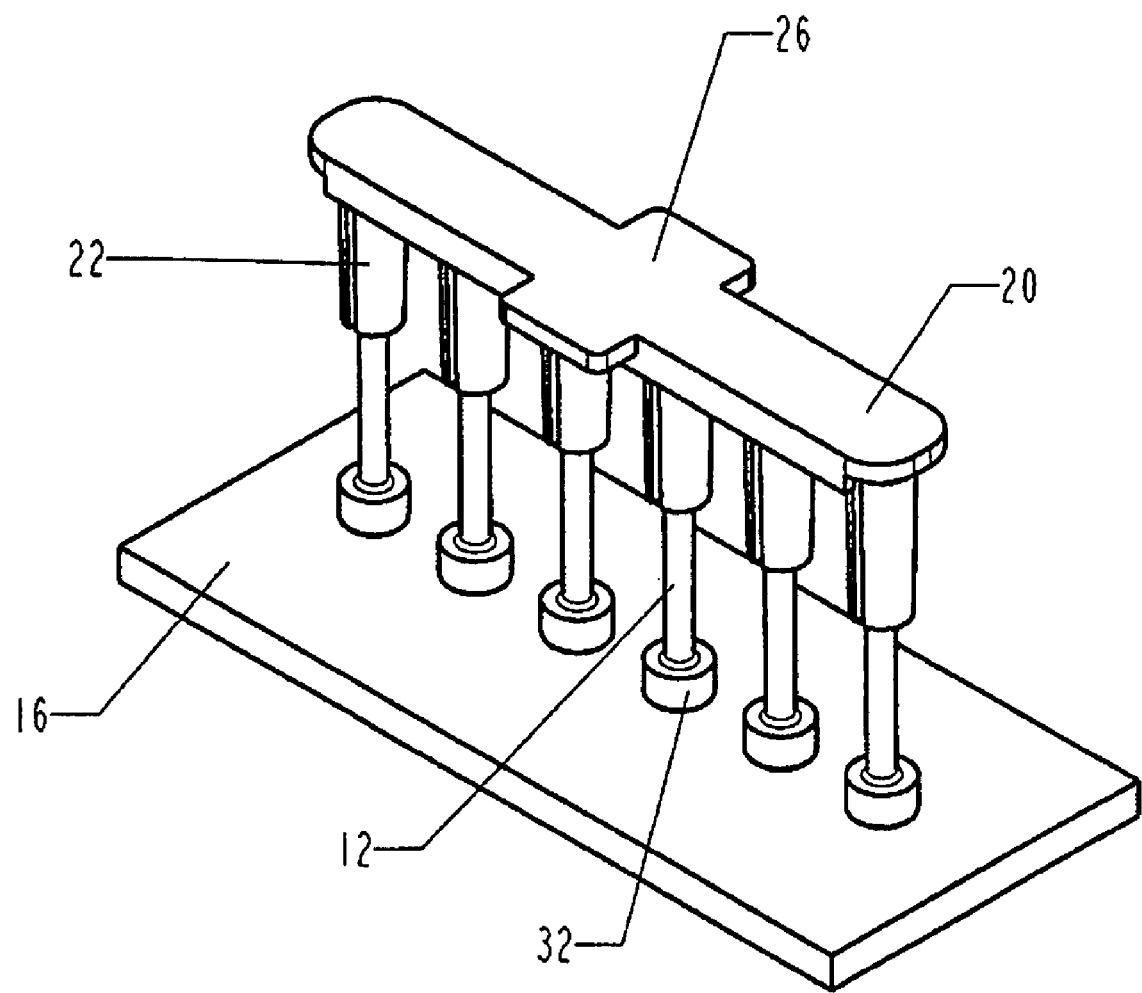
Figure 10:
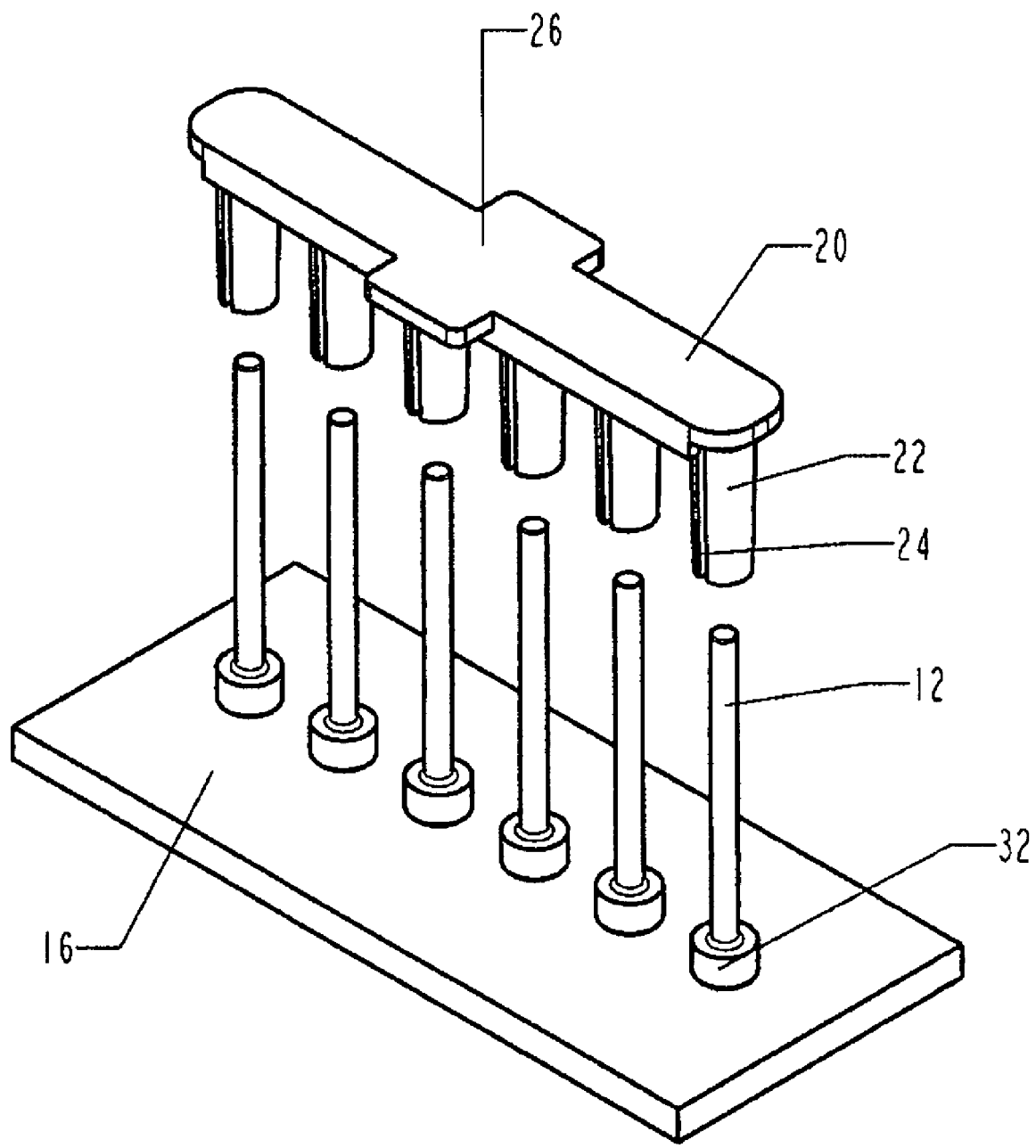

FIGS. 8 to 10 show a third embodiment. To the extent that this agrees with the embodiments described above, the same reference numbers are used, and reference is made to the above description.

In the case of this third embodiment, the configuration of the body 20 having the bushings 22 and the suction surface 26 agrees with that of the first example embodiment.

In contrast to the first example embodiment, the pins 12 are configured for surface assembly. Accordingly, the pins 12 have a lower foot 32 with a wider diameter, with which they are set onto the solder pads of the circuit board 16 in order to be soldered to it as shown in FIG. 9. After the soldering process, the body 20 is pulled off, as FIG. 10 shows.

A fourth embodiment is shown in FIGS. 11 to 15. Here again, the same reference numbers are used for corresponding parts, and reference is made to the above description.

The fourth embodiment agrees with the first example embodiment with regard to the configuration of the body 20 having bushings 22 and the suction surface 26.

However, in contrast to the first example embodiment, the pins 12, which are intended for through-hole assembly, do not have a contact shoulder in order to limit the insertion depth of the pins 12 into the holes of the circuit board 16.

In the case of the fourth example embodiment, the insertion depth of the pins 12 into the holes of the circuit board 16 is limited in that a spacer 34 is formed onto each of the two ends of the body 20, in one piece. The spacers 34 are crosspieces directed against the circuit board at a right angle from the body 20, i.e. parallel to the bushings 22. The spacers 34 extend beyond the bushings 22 in the axial direction, while the pins 12 inserted into the bushings 22 extend axially beyond the spacers in the axial direction.

Figure 11:
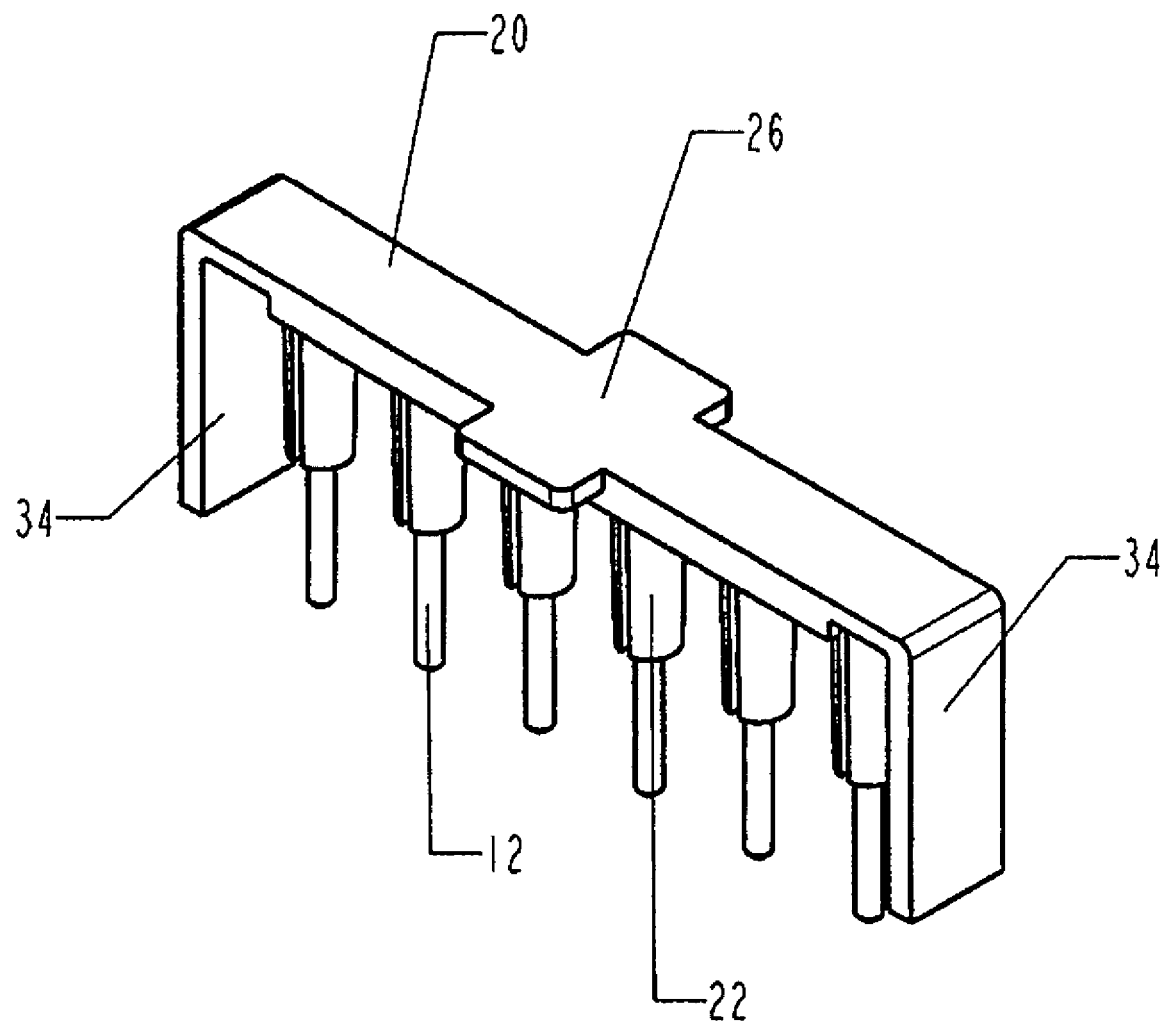
Figure 12:
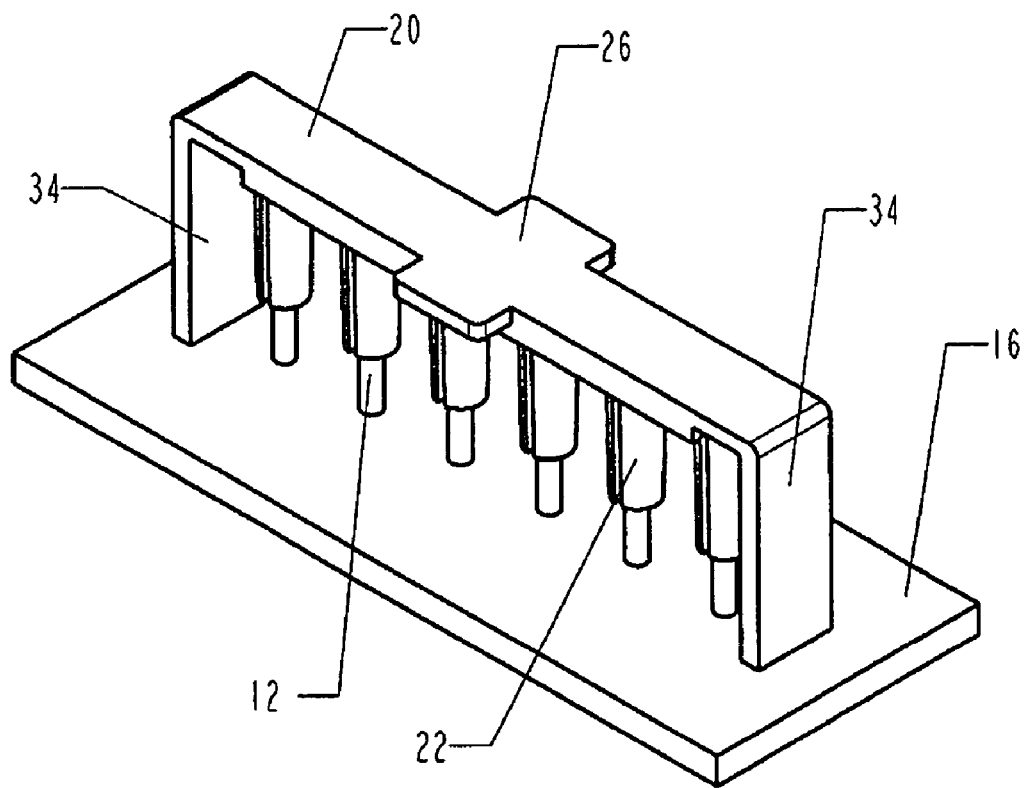
Figure 13:
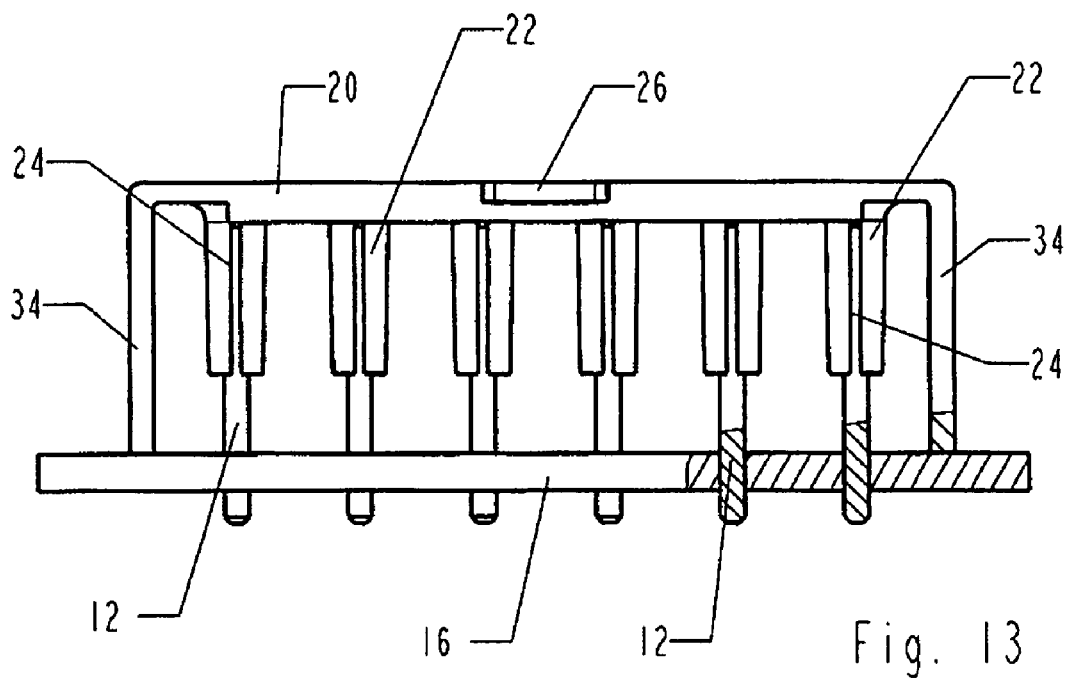

When the component shown in FIG. 11 is set onto the circuit board 16 by means of the automated assembly device, as shown in FIGS. 12 and 13, the pins 12 penetrate into the holes of the circuit board 16 until the spacers 34 make contact with the circuit board 16, as shown in FIGS. 12 and 13. The insertion depth of the pins 12 into the circuit board 16 is defined thereby.

Figure 14:
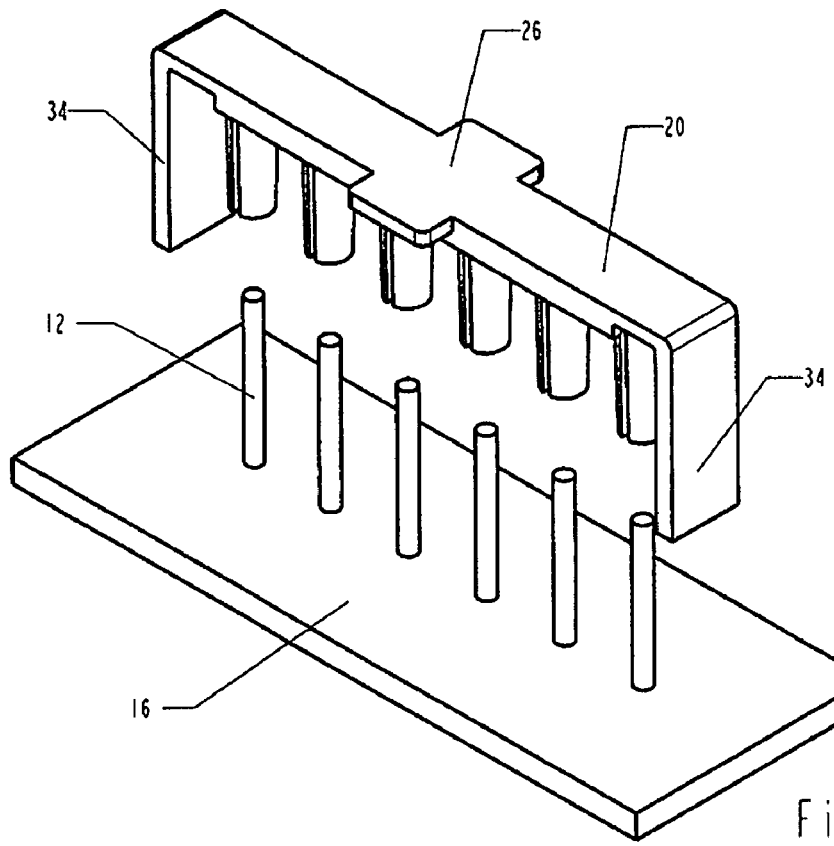
Figure 15:
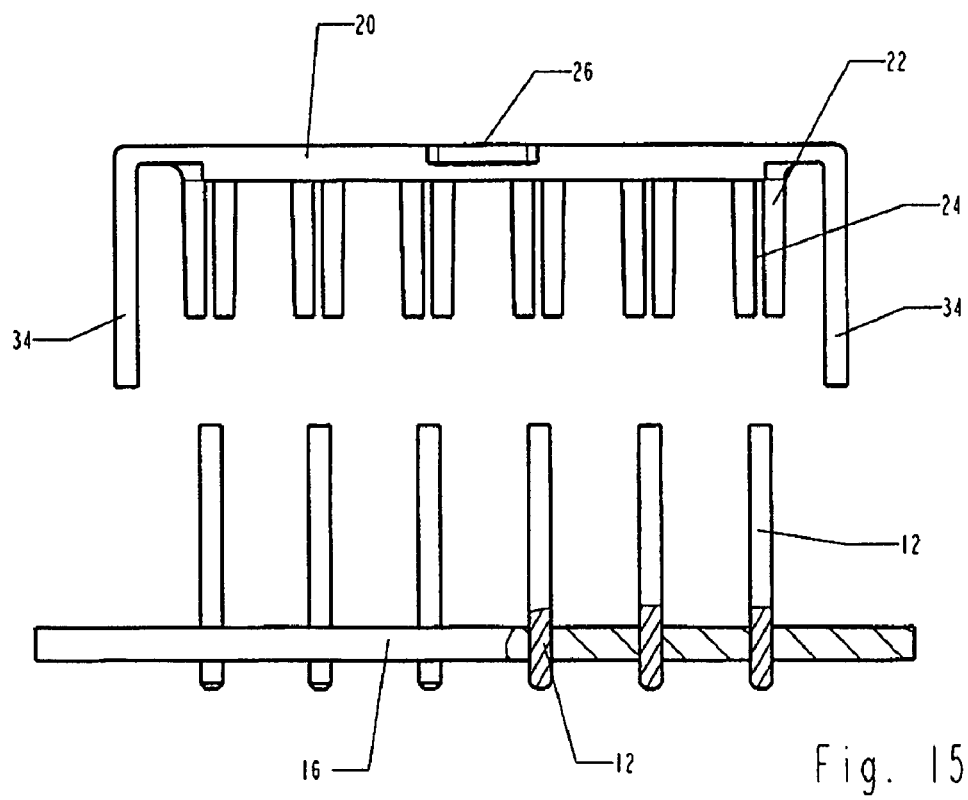
Figure 16:
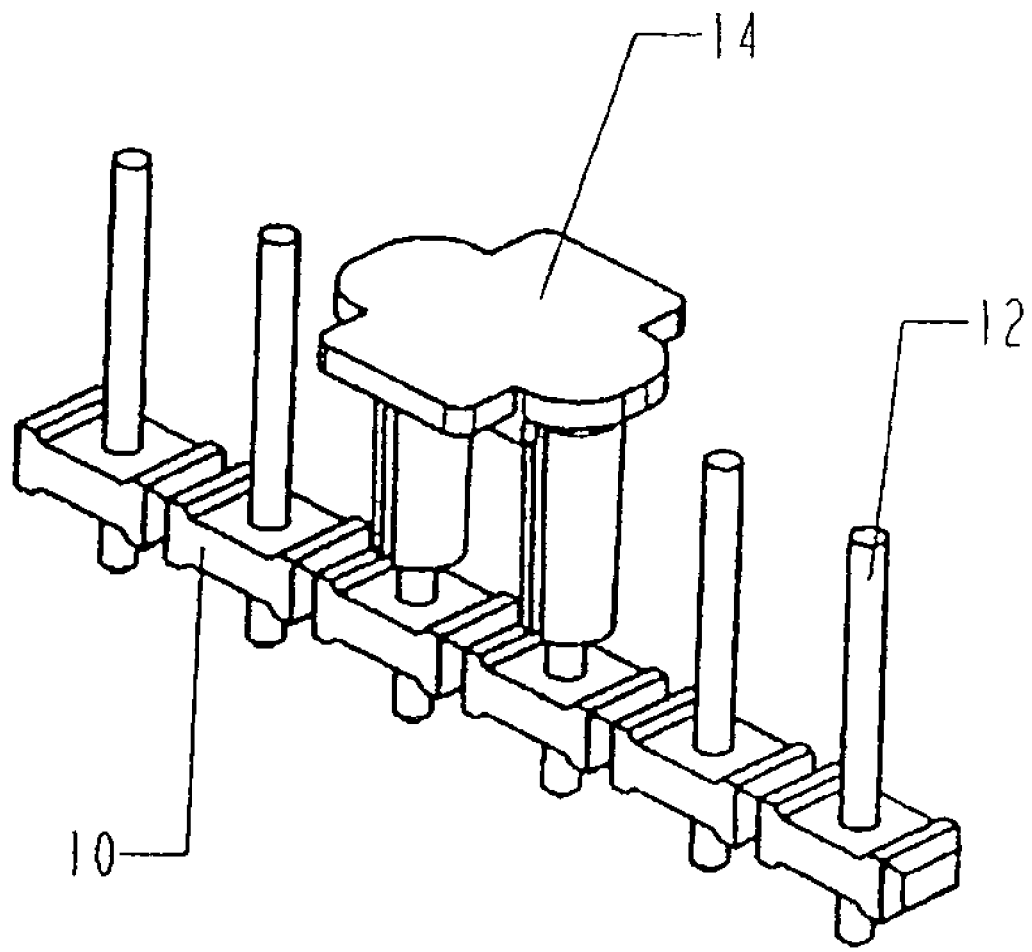
Figure 17:
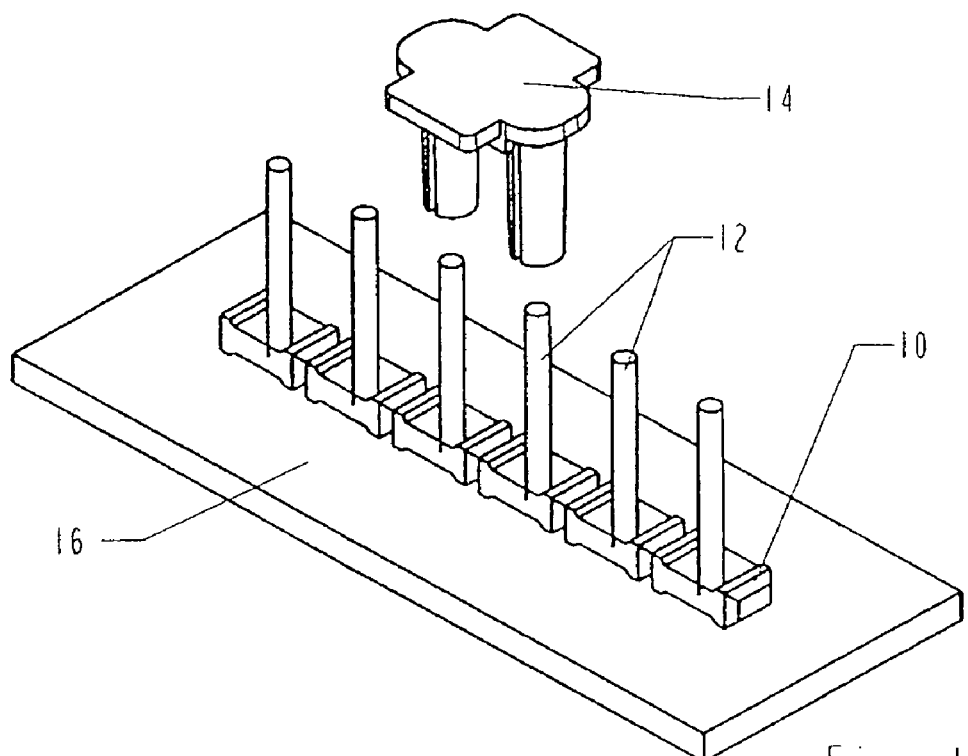
Figure 18:
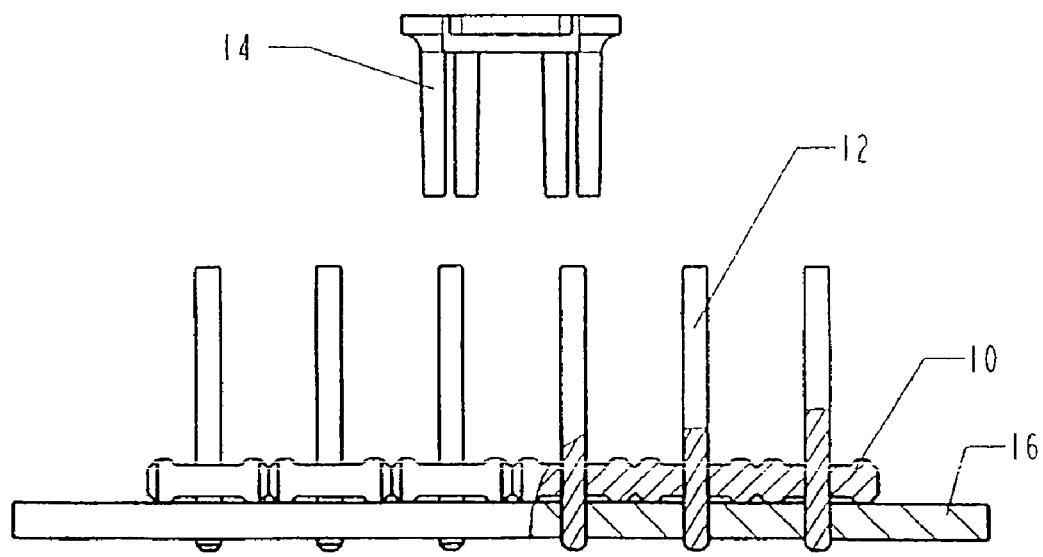
Figure 19:
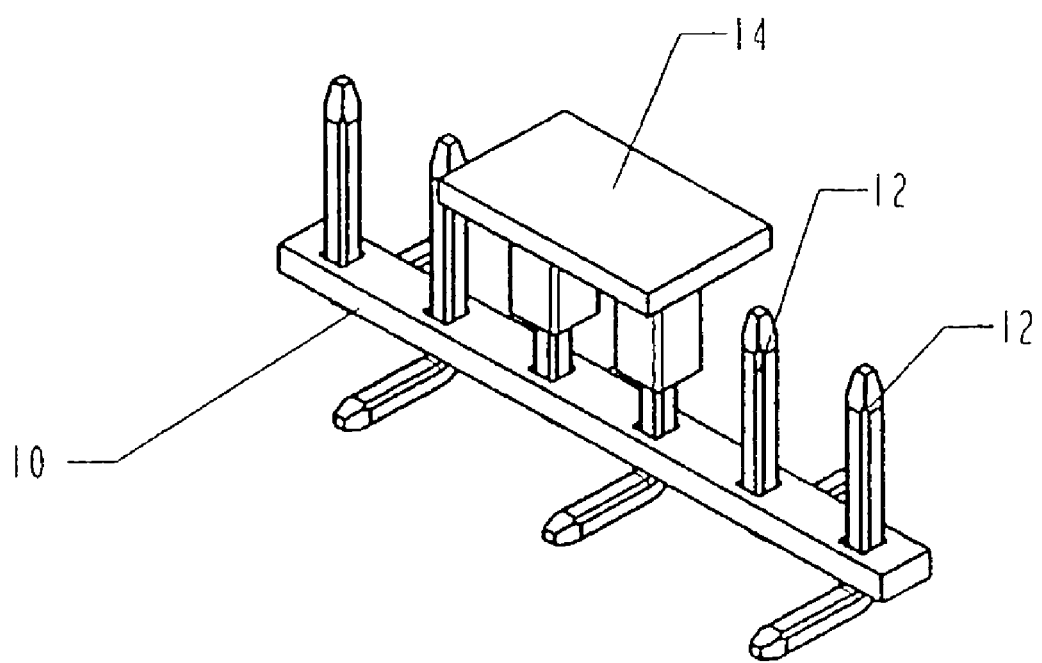
Figure 20:
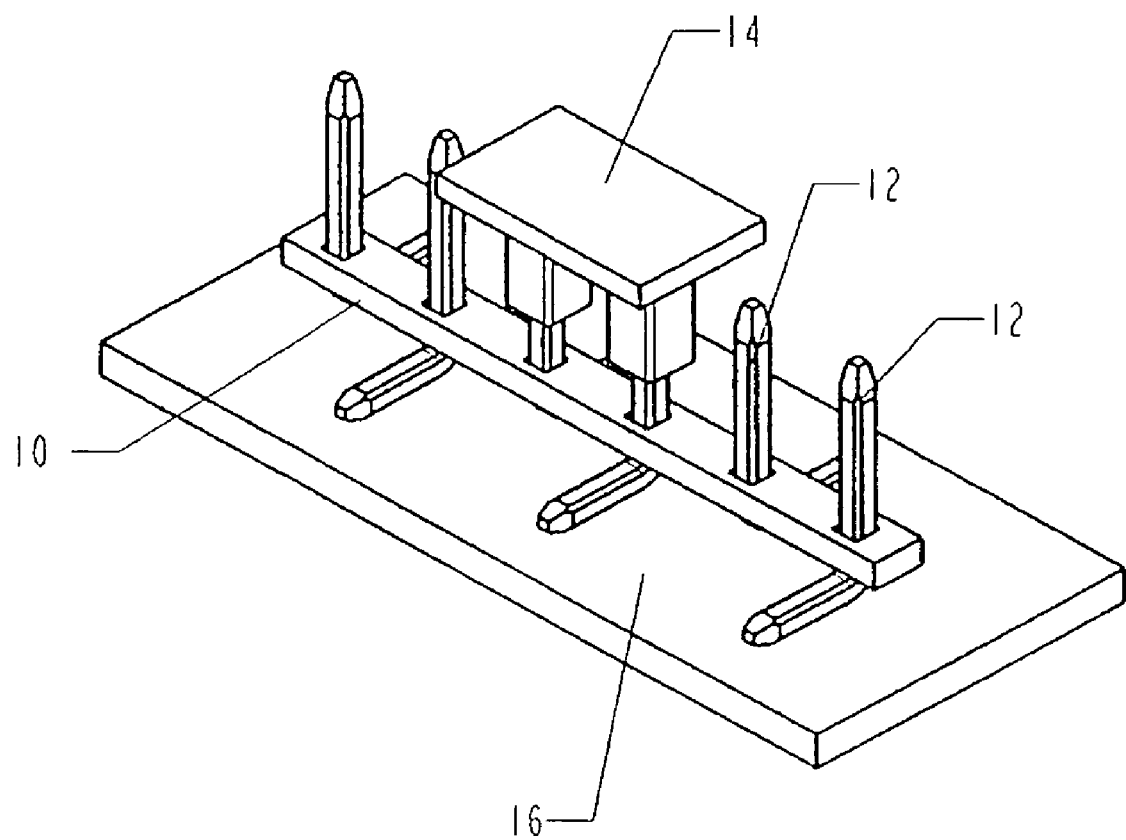

After the soldering process, the body 20 is pulled off the pins 12, which have now been fixed in place in the circuit board 16, in an upward direction, as shown in FIGS. 14 and 15.

REFERENCE SYMBOL LIST 10 body
12 pins
14 small suction plate
16 circuit board
18 contact shoulder
20 body
22 bushings
24 slit
26 suction surface
28 angled end
30 free path
32 foot
34 spacer

The invention claimed is:

1. A device for assembling pins (12) arranged in at least one row, spaced apart from each another, which pins serve as electrical contacts, onto a circuit board (16) having an insulating body that accommodates the pins (12), positions and orients them axially in the spaced configuration of the row, and having a suction surface to grasp the row of pins (12) for purposes of assembly by means of an automated assembly device, characterized in that the body (20) grasps each of the ends of the pins (12) that face away from the circuit board (16) with a force fit in the direction of the axis of the pins (12), and with a positive fit to prevent tilting of the axis of the pins (12), the body (20) can be pulled off after the pins (12) are assembled, and the suction surface (26) is formed on the surface of the body (20) that faces away from the pins (12), wherein the pins (12) are configured for through-hole assembly and have an end that can be inserted into a hole of the circuit board (16), wherein at least one spacer (34) is formed onto the body (20), which spacer comes to a stop on the circuit board (16) and limits the insertion depth of the pins (12) into the circuit board (16).

2. The device according to claim 1, characterized in that the body (20) has bushings (22) for clamping onto the pins (12).

3. The device according to claim 2, characterized in that the bushings (22) are formed onto the side of the body (20) that faces the circuit board (16) and project from the body.

4. The device according to claim 3, characterized in that the bushings (22) have at least one axial slit (24).

5. The device according to claim 1, characterized in that the suction surface (26) is formed by a widened region of the surface of the body (20).

6. The device according to claim 1, characterized in that the pins (12) are configured for surface assembly and have an end that can be set onto the circuit board (16).

7. The device according to claim 6, characterized in that, when the pins (12) are inserted into the body (20), a free path (30) remains behind the inserted end of the pin (12), which permits the pin (12) to be pressed into the body (20), in order to balance out tolerances.

8. The device according to claim 1, characterized in that the pins (12) are configured with a contact shoulder (18) that limits their insertion depth into the circuit board (16).

* * * * *